United States Patent [19]
Yamagata et al.

[11] Patent Number: 5,595,814
[45] Date of Patent: Jan. 21, 1997

[54] WEAR RESISTANT FILM

[75] Inventors: Hiroshi Yamagata, Toyama-ken; Shinichiro Maruyama, Toyama, both of Japan

[73] Assignee: YKK Corporation, Tokyo, Japan

[21] Appl. No.: 437,303

[22] Filed: May 9, 1995

[30] Foreign Application Priority Data

Jun. 1, 1994 [JP] Japan ................................. 6-140749

[51] Int. Cl.$^6$ .................................................. C23C 14/08
[52] U.S. Cl. .................... 428/216; 428/336; 428/469; 428/472; 428/701; 428/702
[58] Field of Search ............................ 428/472, 701, 428/702, 469, 216, 336

[56] References Cited

U.S. PATENT DOCUMENTS

| | | | |
|---|---|---|---|
| 3,649,359 | 3/1972 | Apfel | 350/164 |
| 3,687,713 | 8/1972 | Adams | 117/71 R |
| 4,045,125 | 8/1977 | Farges | 350/166 |
| 4,517,217 | 5/1985 | Hoffman | 428/216 |
| 4,643,518 | 2/1987 | Taniguchi | 350/1.6 |
| 4,673,248 | 6/1987 | Taguchi et al. | 350/166 |

FOREIGN PATENT DOCUMENTS 237622  9/1987  European Pat. Off. .

OTHER PUBLICATIONS

Patent Abstracts of Japan, vol. 017, No. 171, Apr. 2, 1993.
Patent Abstracts of Japan, vol. 12, No. 372, Oct. 5, 1988.
Patent Abstracts of Japan, vol. 15, No. 27, Jan. 22, 1991.

*Primary Examiner*—Archene Turner
*Attorney, Agent, or Firm*—Finnegan, Henderson, Farabow, Garrett & Dunner, L.L.P.

[57] ABSTRACT

Disclosed is a wear-resistant film deposited on an aluminum alloy substrate with high adhesiveness by a physical vapor deposition process. On the surface of the aluminum alloy substrate, an aluminum oxide film is formed through the medium of a silicon oxide film. The deposition of the silicon oxide film and the aluminum oxide film on the surface of the aluminum alloy substrate is carried out by a physical vapor deposition process such as the sputtering process and the ion plating process.

9 Claims, 3 Drawing Sheets

TO VACUUM PUMP

WEAR RESISTANT FILM

BACKGROUND OF THE INVENTION

1. Field of the Invention

This invention relates to a wear-resistant film and more particularly to a wear-resistant film having an aluminum oxide film formed on a surface of a substrate made of aluminum or an aluminum alloy (hereinafter referred to as "aluminum alloy substrate") through the medium of a silicon oxide film.

2. Description of the Prior Art

It is known that an aluminum oxide film manufactured by a sputtering process has a low friction coefficient and relatively large durability to resist friction as compared with films of such other ceramic substances as TiC, TiN, BN, and $SiO_2$. Thus, the adoption of the aluminum oxide film as a surface protecting film (wear-resisting film) for aluminum alloy building materials, personal ornaments made of aluminum alloy (such as watches), machine parts, and the like has been contemplated.

Such surface protecting films as wear-resistant films are generally required to excel in adhesiveness to substrates.

The formation of a wear-resistant film on an aluminum alloy substrate is generally carried out by directly superposing an aluminum oxide film on the aluminum alloy substrate. The aluminum oxide film formed by this method, however, does not exhibit satisfactory adhesiveness to the aluminum alloy substrate and entails the possibility of being peeled off the substrate under high load and cannot be expected to manifest excellent wear resistance.

In the circumstances, a technique which is capable of forming an aluminum oxide film exhibiting high adhesiveness to an aluminum alloy substrate has long been desired.

SUMMARY OF THE INVENTION

A primary object of the present invention is to provide a wear-resistant film which is produced by forming an aluminum oxide film with high adhesiveness on an aluminum alloy substrate by a physical vapor deposition process and consequently enabled to withstand friction under high load.

Another object of the present invention is to provide an article made of aluminum or an aluminum alloy and coated with a wear-resistant film which exhibits high resistance to scratching and to wear under high load.

To accomplish the objects mentioned above, in accordance with the present invention, there is provided a wear-resistant film formed on an aluminum alloy substrate, which comprises a silicon oxide film deposited on the surface of the substrate and an aluminum oxide film deposited on the silicon oxide film.

The formation of the silicon oxide film and the aluminum oxide film on the surface of the aluminum alloy substrate is carried out by the physical vapor deposition process such as, for example, a sputtering process and an ion plating process. Among other physical vapor deposition processes available for the formation, the sputtering process proves particularly desirable.

BRIEF DESCRIPTION OF THE DRAWINGS

Other objects, features, and advantages of the invention will become apparent from the following description taken together with the drawings, in which.

DETAILED DESCRIPTION OF THE INVENTION

The present inventors have found that a silicon oxide ($SiO_2$) film exhibits high adhesiveness to both an aluminum alloy substrate and an aluminum oxide ($Al_2O_3$) film. On the basis of this knowledge, the wear-resistant film of the present invention is formed by precoating an aluminum alloy substrate with the silicon oxide film exhibiting high adhesiveness to both the aluminum alloy substrate and the aluminum oxide film, as an intermediate layer, by such a physical vapor deposition process as the sputtering process and then forming the aluminum oxide film on the intermediate layer by a physical vapor deposition process such as the sputtering process.

By causing the silicon oxide film excelling in adhesiveness to both the aluminum alloy substrate and the aluminum oxide film to be interposed as the intermediate layer therebetween as described above, there is obtained a wear-resistant film which manifests a large critical load (the load existing at the moment of film peeling) in a scratch test, enjoys improved adhesiveness, exhibits enhanced resistance to scratching and to wear under high load, and fully functions as a surface-protecting film of the aluminum alloy substrate.

The thickness of the precoat layer of silicon oxide mentioned above is desired to be not less than 0.005 μm, preferably to fall in the range of from 0.01 to 20 μm. If the thickness of the silicon oxide film as an intermediate layer is less than 0.005 μm, the silicon oxide film will be at a disadvantage in incurring difficulty in acquiring a fully satisfactory function as a layer for enhancing adhesiveness of the aluminum oxide film to the aluminum alloy substrate and consequently suffering a decrease in the effect of improving the adhesiveness of the films. Conversely, if the thickness of the silicon oxide film exceeds 20 μm, the silicon oxide film will be at a disadvantage in diminishing the improvement to be attained in the durability to resist friction.

Then, the thickness of the aluminum oxide film of the surface layer is desired to be in the range of from 0.1 to 20 μm. If the thickness of the aluminum oxide film is less than 0.1 μm, the produced film will suffer a deterioration in the characteristics such as low friction and durability to resist friction. Conversely, if this thickness exceeds 20 μm, the excess will bring about no proportional addition to the improvement of durability to resist friction and will attain no economy.

Now, the present invention will be described more specifically below with reference to working examples and a comparative example.

Figure 1:
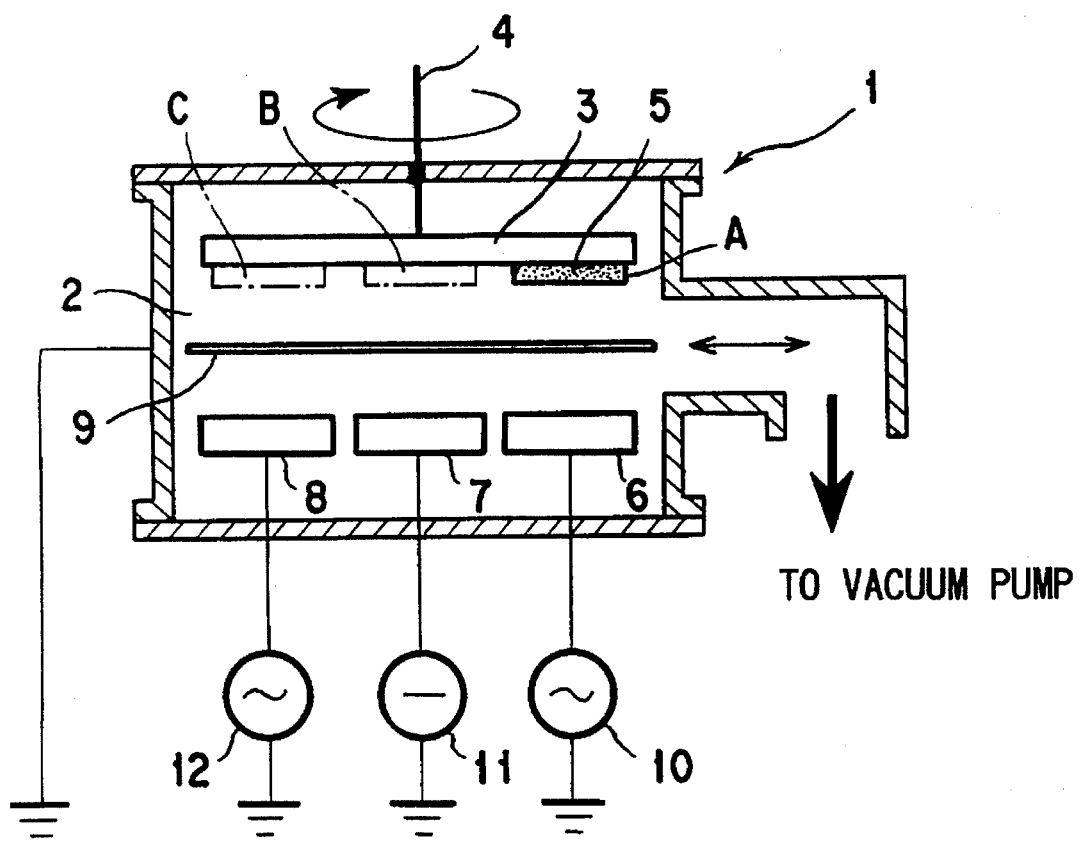
FIG. 1 is a schematic structural diagram of a sputter device used in working examples and a comparative example which will be cited hereinbelow.

FIG. 1 schematically shows the construction of a sputter device used in the following working examples and a comparative example. The sputter device 1 has a substrate holder 3 disposed in a film-forming chamber or deposition chamber 2 and has a silicon oxide target (source of evaporation) 6, a titanium target 7, and an aluminum target 8 each opposed to the substrate holder 3. The silicon oxide target 6 and the aluminum target 8 are connected respectively to high frequency (RF) power sources 10 and 12 and the titanium target 7 is connected to a direct current (DC) power source 11. The substrate holder 3 which supports a substrate 5 in place is capable of rotating round a rotating shaft 4 as the center and moving the substrate 5 to the position A opposed to the silicon oxide target 6, the position B opposed to the titanium target 7, and the position C opposed to the aluminum target 8. A shutter 9 is movably interposed between the substrate holder 3 and the targets 6, 7, and 8 so as to shield the targets during the pre-sputtering process.

EXAMPLE 1

Manufacture of aluminum oxide film on an aluminum alloy substrate precoated with silicon oxide film:

An aluminum alloy A6063 sheet destined to form a substrate was subjected to mirror polishing, set in the substrate holder of the sputter device shown in FIG. 1, and left standing in an evacuated interior of the deposition chamber. After the evacuation, Ar gas was introduced into the deposition chamber to adjust the internal pressure thereof to 1.0 to 2.0 Pa. Then, the aluminum alloy sheet was subjected to sputter etching. The internal pressure of the deposition chamber was adjusted to 1.0 to 0.3 Pa and the silicon oxide target was energized with RF power to induce sputter discharge. Consequently, a silicon oxide film was deposited in a prescribed thickness on the substrate.

After the deposition of the precoat layer of silicon oxide on the substrate, the substrate was moved onto the aluminum target. Subsequently, a mixed gas of Ar and $O_2$ was introduced into the deposition chamber and the internal pressure of the deposition chamber was adjusted to 1.0 to 0.3 Pa. At this time, the partial pressure of $O_2$ was in the range of from 0.2 to 0.02 Pa. Then, the aluminum target was energized with RF power to induce sputter discharge and deposit an aluminum oxide film in a prescribed thickness on the silicon oxide film of the substrate.

Evaluation of adhesiveness:

The adhesiveness of a film was evaluated by the use of a scanning scratch tester. This tester is adapted to press a diamond ball 100 μm in diameter attached to a spring onto the film at a prescribed rate of fall and inflict a scratch on the film. At this time, a vibration 100 μm in amplitude is exerted on the diamond ball perpendicularly to the direction of scratching. In this test, the load under which the film peels is referred to as "critical load, Lc". The magnitude of Lc is used for rating the adhesiveness of the film under test.

The construction of the wear-resistant film manufactured in Example 1 mentioned above and the critical load, Lc, of the film are shown in Table 1. For comparison, a sample was produced by following the procedure of Example 1 while omitting the step of precoating the substrate with a silicon oxide film and tested. The results are also shown in Table 1.

TABLE 1

| Substrate | Thickness of silicon oxide film (μm) | Thickness of aluminum oxide film (μm) | Critical load, Lc (gf) |
|---|---|---|---|
| Aluminum alloy A6063 | None | 0.5 | 14.6 |
| Same as above | 0.01 | 0.5 | 18.2 |

It is clearly remarked from the results shown in Table 1 that the precoating of the substrate with the silicon oxide film increased the critical load by 25% and improved the adhesiveness of the wear-resistant film to the substrate.

COMPARATIVE EXAMPLE 1:

Manufacture of aluminum oxide film on an aluminum alloy substrate precoated with titanium oxide film (comparative piece):

In the same manner as in the manufacture of the precoat of silicon oxide in Example 1 cited above, the setting of a substrate (using aluminum alloy A1100 and A6063, in this case) and the evacuation of the deposition chamber were carried out, and then a mixed gas of Ar and $O_2$ was introduced into the deposition chamber. Thereafter, the internal pressure of the deposition chamber was adjusted to 1.0 to 2.0 Pa. At this time, the partial pressure of $O_2$ was 0.2 to 0.02 Pa. Subsequently, the titanium target was energized with a DC voltage to induce sputter discharge and deposit a titanium oxide film in a prescribed thickness on the substrate.

After the deposition of the precoat layer of titanium oxide, the substrate was moved onto the aluminum target. Then, a mixed gas of Ar and $O_2$ was introduced to adjust the internal pressure of the deposition chamber to 1.0 to 0.3 Pa. At this time, the partial pressure of $O_2$ was 0.2 to 0.02 Pa. Subsequently, the aluminum target was energized with RF power to induce sputter discharge and deposit an aluminum oxide film in a prescribed thickness on the titanium oxide film of the substrate.

The produced film was subjected to the scanning scratch test in the same manner as in Example 1. The construction of the film and the critical load, Lc, found in the test are shown in Table 2. For comparison, samples were obtained by following the procedure described above while omitting the step of precoating with a titanium oxide film. The results obtained of these samples are also shown in Table 2.

TABLE 2

| Substrate | Thickness of titanium oxide film (μm) | Thickness of aluminum oxide film (μm) | Critical load, Lc (gf) |
|---|---|---|---|
| Aluminum alloy A1100 | None | 0.5 | 6.9 |
| Same as above | 0.01 | 0.5 | 6.7 |
| Aluminum alloy A6063 | None | 0.5 | 15.1 |
| Same as above | 0.01 | 0.5 | 14.5 |

It is clearly noted from the results shown in Table 2 that the precoating with titanium oxide did not attain the effect aimed at by the present invention and rather tended to lower the critical load Lc as compared with a sample not precoated with titanium oxide.

EXAMPLE 2

By the same method as described in Example 1, a silicon oxide film and an aluminum oxide film were formed in varying thicknesses so as to obtain the total thicknesses, 0.1 μm, 0.5 μm, 1.0 μm, and 5.0 μm, respectively, on aluminum alloy A1100 substrates. The produced films were evaluated for adhesiveness by the same scanning scratch test as in Example 1.

Figure 2:
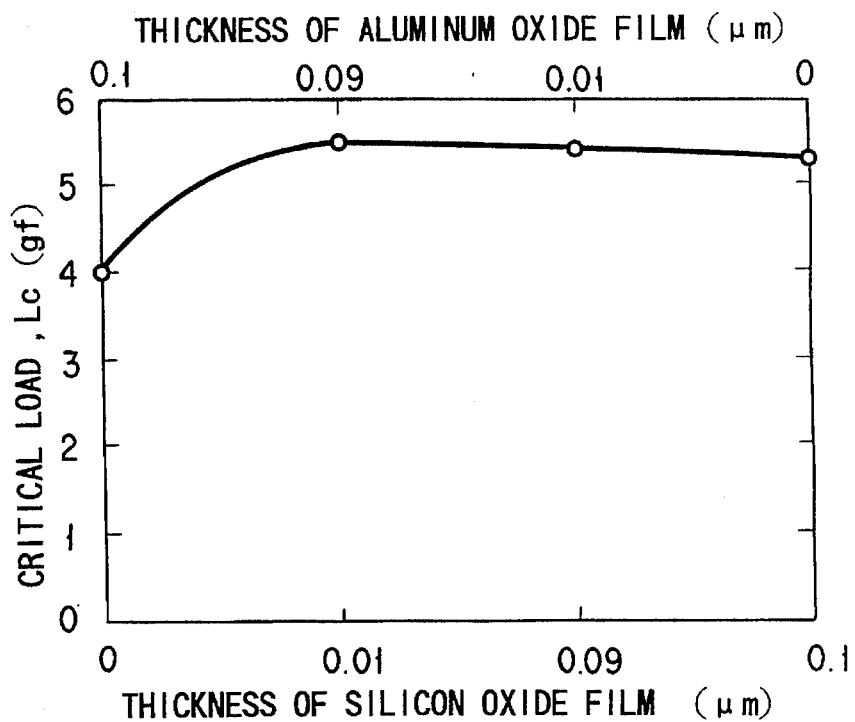
FIGS. 2 to 5 are graphs showing the relations between the thicknesses, and the critical loads, Lc, of the films having a silicon oxide film and an aluminum oxide film formed in total thicknesses, 0.1 μm, 0.5 μm, 1.0 μm, and 5.0 μm, respectively, on substrates.
Figure 3:
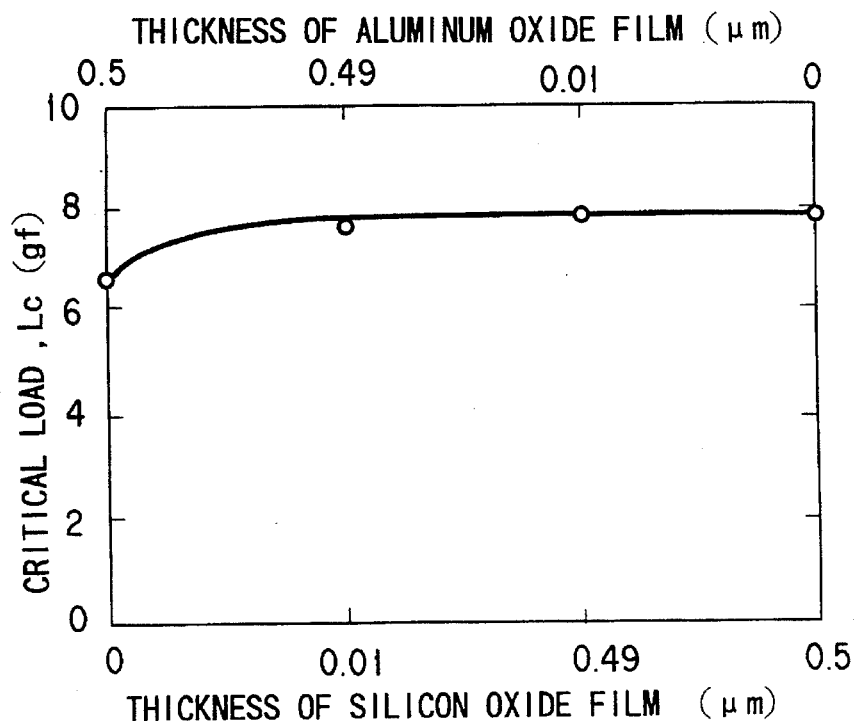
Figure 4:
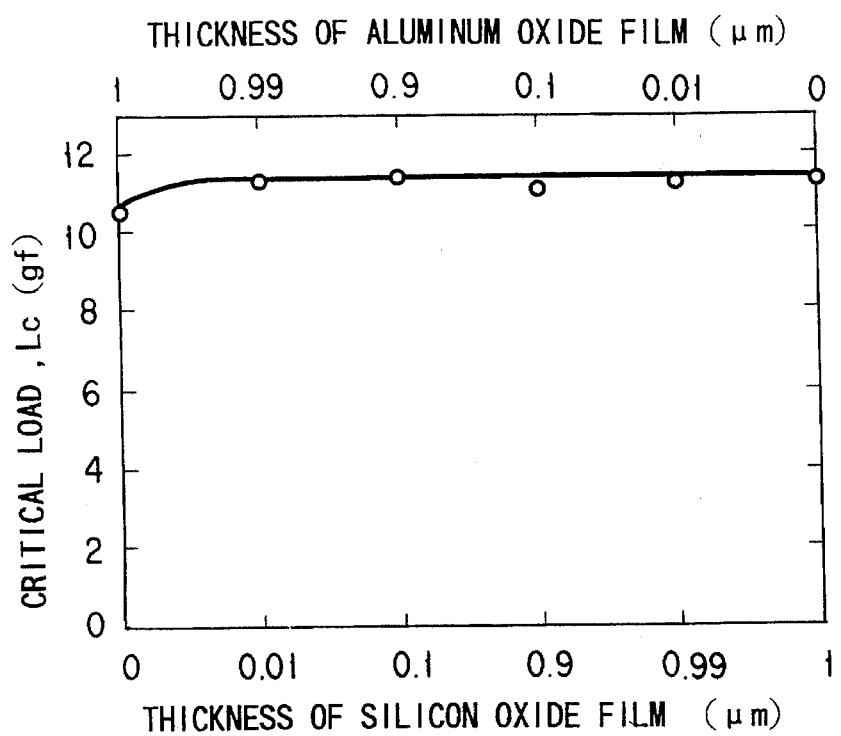
Figure 5:
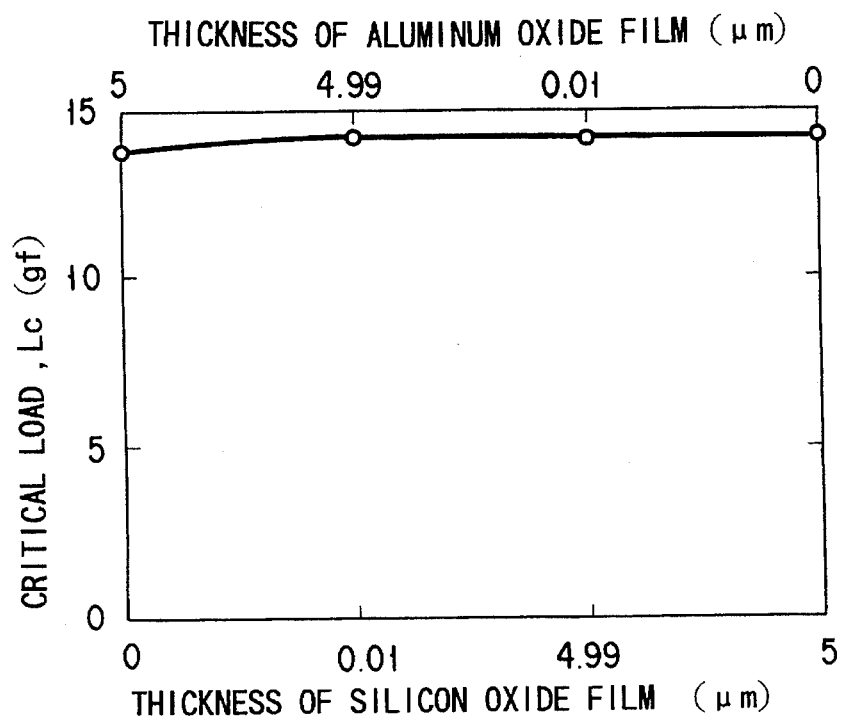

The relation between the thickness and the critical load, Lc, of the film having a silicon oxide film and an aluminum oxide film formed in a total thickness of 0.1 μm on the substrate is shown in FIG. 2, the relation of the film of a total thickness of 0.5 μm in FIG. 3, the relation of the film of a total thickness of 1.0 μm in FIG. 4, and the relation of the film of a total thickness of 5.0 μm in FIG. 5 respectively.

It is clearly noted from the results shown in FIGS. 2 through 5 that the precoating with a silicon oxide film improved the critical load, Lc, to a discernible extent and augmented the adhesiveness. It is further noted that the precoating of silicon oxide film was effective when the thickness thereof was not less than 5 nm, that the increase of the critical load, Lc, practically reached a state of saturation when the thickness exceeded 10 nm, and that the critical load, Lc, increased in proportion as the total thickness of a silicon oxide film and an aluminum oxide film increased. In the films having large total thicknesses, a change in the thickness of the silicon oxide film produced no marked change in the critical load, Lc (see FIG. 5). This is because the aforementioned method used for the evaluation of the adhesiveness is adapted for thin films not exceeding 1 μm.

EXAMPLE 3

By following the procedure of Example 1 while changing the material for the substrate to a rapidly solidified aluminum alloy material, a film was obtained by depositing a silicon oxide film and an aluminum oxide film on the substrate mentioned above by the sputtering process and was evaluated for adhesiveness by the same scanning scratch test as described in Example 1.

The construction of the film thus obtained and the critical load, Lc, found in the test are shown in Table 3. For comparison, a sample was produced by following the procedure described above while omitting the steps of precoating with a silicon oxide film and similarly evaluated. The results are also shown in Table 3.

TABLE 3

| Substrate | Thickness of silicon oxide film (μm) | Thickness of aluminum oxide film (μm) | Critical load, Lc (gf) |
|---|---|---|---|
| Rapidly solidified aluminum alloy | None | 0.5 | 81.3 |
| Same as above | 0.01 | 0.5 | 96.7 |

EXAMPLE 4

By following the procedure of Example 1 while changing the material for the substrate to an extruded material of a rapidly solidified powder (crystalline texture; fine crystals) having a composition of $Al_{88.5}Ni_{8.0}Mm_{3.5}$ (in atomic %), a film was obtained by depositing a silicon oxide film and an aluminum oxide film on the substrate mentioned above by the sputtering process and was evaluated for adhesiveness by the same scanning scratch test as described in Example 1. The scratch test in this case used a diamond pressure ball 15 μm in diameter.

The construction of the film thus obtained and the critical load, Lc, found in the test are shown in Table 4. For comparison, a sample was produced by following the procedure described above while omitting the steps of precoating with a silicon oxide film and similarly evaluated. The results are also shown in Table 4.

TABLE 4

| Substrate | Thickness of silicon oxide film (μm) | Thickness of aluminum oxide film (μm) | Critical load, Lc (gf) |
|---|---|---|---|
| Extruded material of Al-Ni-Mm rapidly solidified powder | None | 0.5 | 4.3 |
| Same as above | 0.01 | 0.5 | 5.9 |

It is clearly noted from Tables 3 and 4 that the effect of the precoating with a silicon oxide film manifested in improving the adhesiveness was obtained likewise when a rapidly solidified aluminum alloy and an extruded material of rapidly solidified powder were used as the material for the substrate.

Since the wear-resistant film of the present invention is produced by precoating an aluminum alloy substrate with a silicon oxide film and then forming an aluminum oxide film further thereon as described above, it exhibits improved adhesiveness, shows a large critical load in the scratch test, and consequently enjoys high resistance to scratching and to wear under high load as compared with a film not precoated with a silicon oxide film.

The wear-resistant film of the present invention, therefore, finds extensive utility as wear-resistant films for various sliding members and, because of transparency, further finds utility as surface-protecting films for aluminum alloy building materials and articles of fine art and design.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by foregoing description and all changes which come within the meaning and range of equivalency of the claims are, therefore, intended to be embraced therein.

What is claimed is:

1. A wear-resistant film formed on a substrate of aluminum or an aluminum alloy, consisting essentially of:

a $SiO_2$ film deposited on a surface of said substrate, and an aluminum oxide film deposited on said $SiO_2$ film.

2. The wear-resistant film according to claim 1, wherein said $SiO_2$ film and said aluminum oxide film are formed by a physical vapor deposition process.

3. The wear-resistant film according to claim 1, wherein said $SiO_2$ film and said aluminum oxide film are formed by a sputtering process.

4. The wear-resistant film according to claim 1, wherein said $SiO_2$ film and said aluminum oxide film are formed by an ion plating process.

5. The wear-resistant film according to claim 1, wherein the thickness of said $SiO_2$ film is not less than 0.005 μm.

6. The wear-resistant film according to claim 1, wherein the thickness of said $SiO_2$ film is in the range of from 0.01 to 20 μm.

7. The wear-resistant film according to claim 1, wherein the thickness of said aluminum oxide film is in the range of from 0.1 to 20 μm.

8. An article made of aluminum or an aluminum alloy and coated with a wear-resistant film, the wear-resistant film consisting essentially of a $SiO_2$ film deposited on a surface of said article and an aluminum oxide film deposited on said SiO$_2$ film.

9. The article according to claim 8, wherein the thickness of said SiO$_2$ film is in the range of from 0.005 to 20 μm and the thickness of said aluminum oxide film is in the range of from 0.1 to 20 μm.

* * * * *